United States Patent [19]
Nagai

[11] Patent Number: 5,920,586
[45] Date of Patent: Jul. 6, 1999

[54] SEMICONDUCTOR LASER

[75] Inventor: Yutaka Nagai, Tokyo, Japan

[73] Assignee: Mitsubishi Denki Kabushiki Kaisha, Tokyo, Japan

[21] Appl. No.: 08/970,619

[22] Filed: Nov. 14, 1997

[30] Foreign Application Priority Data

Aug. 25, 1997 [JP] Japan ..................................... 9-227888

[51] Int. Cl.$^6$ ...................................................... H01S 3/19
[52] U.S. Cl. ............................................... 372/46; 372/45
[58] Field of Search ........................................ 372/45, 46

[56] References Cited

U.S. PATENT DOCUMENTS 5,493,577  2/1996  Choquette et al. ........................ 372/46
5,696,784  12/1997 Srinivasan et al. ....................... 372/46

*Primary Examiner*—Rodney Bovernick
*Assistant Examiner*—Quyen Phan Leung
*Attorney, Agent, or Firm*—Leydig, Voit & Mayer

[57] ABSTRACT

A semiconductor laser includes a first conductivity type semiconductor substrate; a first conductivity type lower cladding layer, an active layer, and a second conductivity type first upper cladding layer, disposed in this order on the first conductivity type semiconductor substrate; a second conductivity type current confinement layer disposed on the first upper cladding layer, made of a semiconductor material containing a higher composition ratio of Al than the first upper cladding layer and having a stripe shape with a width and extending in a direction; and a second conductivity type second upper cladding layer made of the same material as the first upper cladding layer, disposed on the current confinement layer so that a central longitudinal axis of the current confinement layer is located directly opposite a central longitudinal axis of the current confinement region, and having a ridge structure with a bottom surface facing the first upper cladding layer, in contact with, and having a width larger than the current confinement layer, the grooves limiting the area in which current can flow between the lower cladding layer and the first upper cladding layer, eliminating leakage current that is not effective in generating light.

4 Claims, 6 Drawing Sheets

SEMICONDUCTOR LASER

FIELD OF THE INVENTION

The present invention relates to a semiconductor laser and a method of fabrication thereof, and, more particularly, to a ridge type semiconductor laser and a method of fabrication thereof.

BACKGROUND OF THE INVENTION

FIG. 3 is a cross-sectional view of a conventional ridge type semiconductor laser including a ridge waveguide, the view taken along a direction perpendicular to the longitudinal direction of the laser resonator. In the figure, an n type $Al_{0.3}Ga_{0.7}As$ lower cladding layer 2 (hereinafter "n type" is shortened to "n-"), a quantum well active layer 3, a p type $Al_{0.3}Ga_{0.7}As$ first upper cladding layer 4 (hereinafter "p type" is shortened to "p-"), and a p-$Al_{0.7}Ga_{0.3}As$ etch-stopping layer 14 are laminated in this order on an n-GaAs substrate 1.

A ridge waveguide 9 having a ridge structure shaped like a stripe extending in the longitudinal direction of the laser resonator/comprises a p-$Al_{0.3}Ga_{0.7}As$ second upper cladding layer 6 and a p-GaAs contact layer 7 which are successively laminated on the etch-stopping layer 14. An insulating film 15 is formed in such a way as to cover the surfaces of the ridge waveguide 9 and the etch-stopping layer 14, having, on the upper flat surface of the ridge waveguide 9, an opening 16 at the bottom of which the p-GaAs contact layer 7 is exposed. A p side electrode 12 is disposed on both the insulating film 15 and the opening 16 covering both of them. An n side electrode 13 is disposed on the rear surface of the substrate 1 in ohmic contact with the substrate 1.

FIGS. 4(a) to 4(d) are cross-sectional views of the conventional ridge type semiconductor laser taken along a direction perpendicular to the longitudinal direction of the laser resonator, illustrating a fabrication process thereof. In the figure, the same reference numerals as those shown in FIG. 3 designate the identical or corresponding parts; reference numeral 8 designates an insulating film disposed on the p-GaAs contact 7, which is made of $Si_3N_4$, $SiO_2$ or the like.

A description is given of the fabrication process of the conventional ridge type semiconductor laser, referring to FIGS. 4(a) to 4(d).

As shown in FIG. 4(a), on the n-GaAs substrate 1 in a wafer state, the n-$Al_{0.3}Ga_{0.7}As$ lower cladding layer 2, the quantum well active layer 3, the p-$Al_{0.3}Ga_{0.7}As$ first upper cladding layer 4, the p-$Al_{0.7}Ga_{0.3}As$ etch-stopping layer 14, p-$Al_{0.3}Ga_{0.7}As$ second upper cladding layer 6, and the p-GaAs contact layer 7 are epitaxially grown in this order.

Thereafter, as shown in FIG. 4(b), the wafer is completely covered with the insulating film 8. The insulating film 8 is patterned to have a stripe-shaped surface. This stripe-shaped insulating film 8 serves as a mask for ridge-etching, namely, etching in order to produce a ridge waveguide 9.

Thereafter, as shown in FIG. 4(c), using the insulating film 8 as a mask, etching is performed in order to form the ridge waveguide 9. Namely, only the p-GaAs contact layer 7 and the p-$Al_{0.3}Ga_{0.7}As$ second upper cladding layer 6 are etched to produce the ridge waveguide 9, the etching being stopped at the p-$Al_{0.7}Ga_{0.3}As$ etch-stopping layer 14. An example of an etching solution for out such an etching step is a mixture of tartaric acid and hydrogen peroxide.

After the ridge-etching, the stripe-shaped insulating film 8 is removed by wet or dry etching. Thereafter, the entire wafer is covered with an insulating film 15 again as shown in FIG. 4(d). With the use of a photolithographic technique, only a portion of the insulating film 15 positioned on the upper flat surface of the ridge waveguide 9 is removed by dry etching or the like to form the opening 16. Further, the p side electrode 12 is formed on the insulating film 15. Consequently, the p side electrode 12 enables contact with the contact layer 7 only through the opening 16 of the insulating film 15 on the upper portion of the ridge waveguide 9. As a result, the current flows only through the opening 16.

Thereafter, the n side electrode 13 is formed on the rear surface of the substrate 1. The wafer is cleaved into chips, making facets of laser resonators, thereby resulting in a semiconductor as laser shown in FIG. 3.

A description is given of how the conventional ridge type semiconductor laser operates, referring to FIG. 3.

When a voltage is applied across the p side electrode 12 as a plus pole and the n side electrode 13 as a minus pole, holes are injected into the quantum well active layer 3 through the p-GaAs contact layer 7, the p-AlGaAs second upper cladding layer 6 and the p-AlGaAs first upper cladding layer 4, while electrons are injected into the quantum well active layer 3 through the n-GaAs substrate 1 and the n-AlGaAs lower cladding layer 2. Recombination of electrons and holes occurs in the active region of the quantum well active layer 3, producing light by the stimulated emission of radiation. Provided that a sufficient volume of carriers is injected into the active region to produce light beyond loss of the waveguide, laser oscillation will occur.

At this time, since regions except the upper flat surface of the ridge waveguide 9 are covered with the insulating film 15, the current cannot flow across those regions. Namely, the current flows only into the ridge waveguide 9 through the upper flat surface thereof. Thus, the quantum well active layer 3 disposed under the ridge waveguide 9 serves as an active region to produce laser oscillation.

A semiconductor laser generally confines light within an active region due to a difference in the refractive indices between an active layer and cladding layers along a direction perpendicular to the surface of a substrate. Therefore, light confinement along a vertical direction is effective over the entire waveguide of the semiconductor laser. On the other hand, a ridge type semiconductor laser guides light along a transverse direction, i.e. a direction parallel both to the surface of a substrate and to facets of the laser resonator, due to an effective difference in the refractive indices of the ridge waveguide and its adjacent regions. When the width of a ridge waveguide, i.e. the ridge width, is constant, higher modes of oscillation occur more easily as the difference in the refractive indices between these regions becomes larger. Conversely, as the difference in the refractive indices decreases, the tolerable width of the ridge without higher modes increases. Namely, it is possible for a wider ridge to cut off higher frequency transmission modes. In general, it is technically difficult to produce a narrow ridge waveguide because of the limitations of the precision of making a mask for ridge-etching, and so on. Besides, if the ridge width is decreased, the resistance of the entire ridge waveguide increases, which causes a problem such as the generation of heat during the operation of the device. Therefore, it is desired to reduce the difference in refractive indices between the ridge waveguide and its adjacent regions so that even if the ridge width is sufficiently wide, higher modes can still be cut off.

In the conventional semiconductor laser shown in FIG. 3, the p-$Al_{0.3}Ga_{0.7}As$ first upper cladding layer 4 can be made thicker so that the difference in refractive indices along a transverse direction between the ridge waveguide and its adjacent regions is reduced. Accordingly, as the distribution of the refractive index of the active layer 3 is less affected by the ridge waveguide 9, the effective difference between the refractive indices is reduced so that it is possible to make the ridge width wider in order to cut off higher modes of oscillation.

In this case, however, as the thickness of the p-$Al_{0.3}Ga_{0.7}As$ first upper cladding layer 4 increases, the distance from the lower portion of the ridge waveguide 9 to the active layer 3 becomes larger, which causes the current which has been confined at the ridge waveguide 9 to gradually spread out along the transverse direction of the ridge before reaching the active layer 3, increasing the volume of the current which flows into regions, except just under the ridge waveguide 9, being increased to an undesirable level. Namely, as the thickness of the upper cladding layer 4 increases, there arises a problem in that the ineffective current, which does not contribute to the laser oscillation, becomes larger. As a result, the threshold and operating currents of the semiconductor laser increase, which causes a big problem with the characteristics of the device, such as an increase in power consumption, and so on.

SUMMARY OF THE INVENTION

It is an object of the present invention to provide a ridge type semiconductor laser in which the thickness of an upper cladding layer positioned between a ridge waveguide and an active layer is widened without an increase in the ineffective current, and a fabrication process thereof.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention which achieves the objective, a semiconductor laser comprises a first conductivity type semiconductor substrate; and a first conductivity type lower cladding layer, an active layer, a first upper cladding layer of second conductivity, a second conductivity type current confinement layer and a second conductivity type contact layer which are disposed in this order on a first conductivity type semiconductor substrate;

The second conductivity type current confinement layer is disposed on the first upper cladding layer, is made of a semiconductor material which contains a higher composition ratio of Al than the first upper cladding layer and is oxidized except the desired width of current confinement region in the form of a stripe extending in the desired direction. The second upper cladding layer of second conductivity which is made of the same material as the first upper cladding layer, is disposed on the current confinement layer so that the longitudinal center axis thereof is positioned right above the longitudinal center axis of the current confinement region, and is formed with a ridge structure extending like a stripe, the width of one side thereof which is in contact with the current confinement layer being larger than the width of the above-described region which is not oxidized.

Thus provided is a semiconductor laser with superior stability of the horizontal transverse mode and good characteristics of the device without increasing the threshold and operating currents.

According to a second aspect of the present invention which achieves the objective, the above-described semiconductor laser includes a first conductivity type refractive index compensation layer which is disposed within the lower cladding layer in such a way as to be symmetrical to the current confinement layer with respect to the active layer. The compensation layer is made of the same material and has the same thickness as the current confinement layer.

Thus the refractive index along a direction vertical to the surface of the substrate is symmetrical with respect to the active layer so that the transverse mode has a symmetrical form along a direction vertical to the substrate.

According to a third aspect of the present invention which achieves the objective, a semiconductor laser comprises a first conductivity type semiconductor substrate; and a first conductivity type lower cladding layer, an active layer, a first upper cladding layer of second conductivity, a second conductivity type current confinement layer and a second upper cladding layer which are disposed in this order on the first conductivity type semiconductor substrate. The second conductivity type current confinement layer is disposed on the first upper cladding layer, is made of a semiconductor material which contains a higher composition ratio of Al than the first upper cladding layer, and is formed like a stripe with the desired width extending in the desired direction. The second upper cladding layer is made of the same material as the first upper cladding layer, is disposed on the current confinement layer so that the longitudinal center axis thereof is positioned right above the longitudinal center axis of the current confinement layer, and is formed in such a way as to have the ridge structure extending like a stripe, the width of one side thereof which is in contact with the current confinement layer being larger than the above-mentioned desired width of the current confinement layer.

Thus provided is a semiconductor laser with superior stability of the horizontal transverse mode and good characteristics of the device without increasing the threshold and operating currents.

According to a fourth aspect of the present invention which achieves the objective, a fabrication process of the semiconductor laser of the first aspect of the invention includes a procedure to grow the first conductivity type lower cladding layer, the active layer, the first upper cladding layer of second conductivity, the second conductivity type current confinement layer which is made of a semiconductor material containing a higher composition ratio of Al than the first upper cladding layer, and the second upper cladding layer of second conductivity which is made of the same material as the first upper cladding layer in this order on the first conductivity type semiconductor substrate; a procedure to shape the second upper cladding layer into the desired width of ridge by a selective etching of the second upper cladding layer with the use of a mask extending in the desired direction, the current confinement layer being excluded from the etching; and a procedure to oxidize selectively one region of the current confinement layer which is not in contact with the second upper cladding layer and the other region of the current confinement layer which is in contact with the second upper cladding layer except a current confinement region the width of which is shorter than the width of the second upper cladding layer, the first and second upper cladding layers being excluded from the oxidizing.

Thus provided is a semiconductor laser in which the thickness of a first upper cladding layer thereof disposed in between an active layer and a ridge waveguide can be made thick without an increase in the ineffective current.

According to a fifth aspect of the present invention which achieves the objective, in the above-mentioned fabrication process, the procedure of oxidizing the current confinement layer is carried out by a wet oxidation method which is performed by exposing the semiconductor material layer having been grown on the substrate 1 under an atmosphere of water vapor at high temperatures.

Thus provided is a semiconductor laser in which the thickness of a first upper cladding layer thereof disposed in between an active layer and a ridge waveguide can be made thick without an increase in the ineffective current.

DETAILED DESCRIPTION OF THE PREFERRED EMBODIMENTS

Embodiment 1

Figure 1:
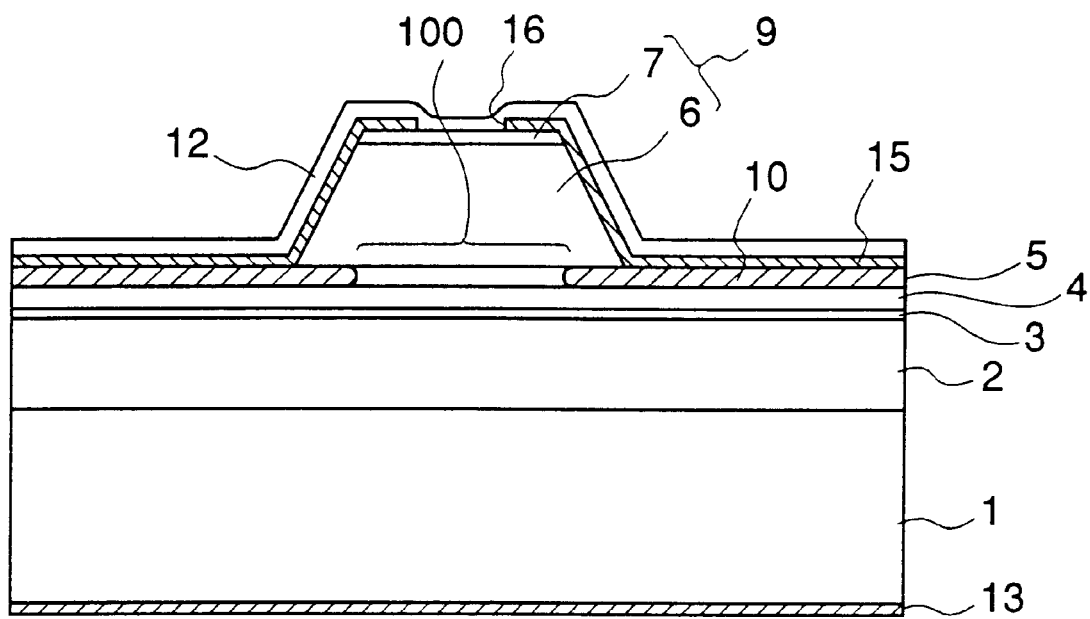
FIG. 1 is a cross-sectional view of a semiconductor laser according to a first embodiment of the present invention.

FIG. 1 is a cross-sectional view of a semiconductor laser, taken along a direction perpendicular to the longitudinal direction of laser resonator, according to the first embodiment of the present invention. In the figure, an n-$Al_{0.3}Ga_{0.7}As$ lower cladding layer 2, a quantum well active layer 3, a p-$Al_{0.3}Ga_{0.7}As$ first upper cladding layer 4, and a p-AlAs current confinement layer 5 are laminated in this order on an n-GaAs substrate 1. The active layer 3 is a quantum well layer which is produced by laminating alternatively for example, GaAs well layers and AlGaAs barrier layers. The p-AlAs current confinement layer 5 comprises one region which is shaped like a stripe extending in the longitudinal direction of the laser resonator of the desired width, i.e. a width measured along a direction parallel to both the surface of the substrate 1 and to the facet of the resonator, and other regions which are oxidized and designated an AlAs oxidized regions 10. The ridge waveguide 9 comprises the p-$Al_{0.3}Ga_{0.7}As$ second upper cladding layer 6 and a p-GaAs contact layer 7 which are laminated in this order on the current confinement layer 5, its shape being a ridge like stripe extending in the longitudinal direction of the laser resonator. A side of the ridge waveguide 9 which is in contact with the substrate 1 has a width from 1 to 4 $\mu$m. The ridge wave guide is disposed on the current confinement 5 so that the longitudinal center axis thereof is positioned right above the longitudinal center axis of the current confinement region 100 which is the portion of the current confinement layer 5 that is not oxidized, and the width of one side thereof which is in contact with the current confinement layer 5 is larger than the width of the current confinement region 100. For example, each of the lateral edges of the ridge waveguide 9 which is in contact with the current confinement layer 5 is positioned respectively about 0.5 $\mu$m outwards from each lateral edge of the current confinement region 100. The insulating film 15 covers both the surfaces of the ridge waveguide 9 and the current confinement layer 5. The opening 16 at the bottom of which the p-GaAs contact layer 7 is exposed, is formed on the upper flat surface of the ridge waveguide 9. The p side electrode 12 is disposed on both the surface of the insulating film 15 and the opening 16 covering them both. The n side electrode 13 is disposed on the rear surface of the substrate 1 in ohmic contact with the substrate 1.

FIGS. 2(a)–2(d) are cross-sectional views of a semiconductor laser taken along a direction perpendicular to the longitudinal direction of laser resonator according to the first embodiment of the present invention. In the figures, the same reference numerals as those shown in FIG. 1 designate identical or corresponding parts. An insulating film 8 made of $Si_3N_4$, $SiO_2$ or the like is disposed on the contact layer 7.

A description is given of the fabrication process of the semiconductor laser according to the first embodiment of the present invention, referring to FIG. 1.

Figure 2:
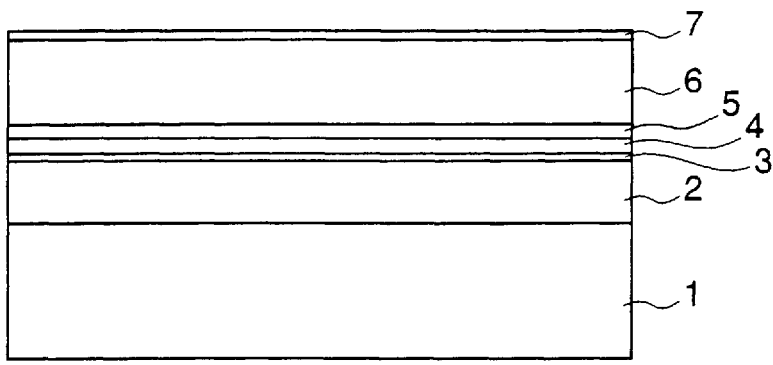
FIGS. 2(a)–2(d) are cross-sectional views illustrating a fabrication process of a semiconductor laser according to a first embodiment of the present invention.
Figure 2:
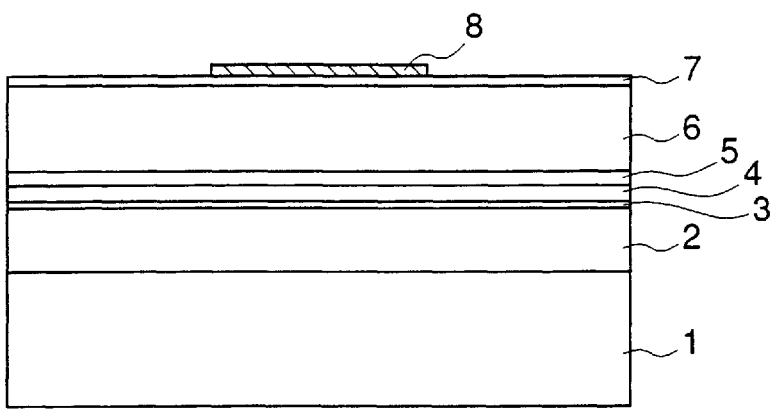
Figure 2:
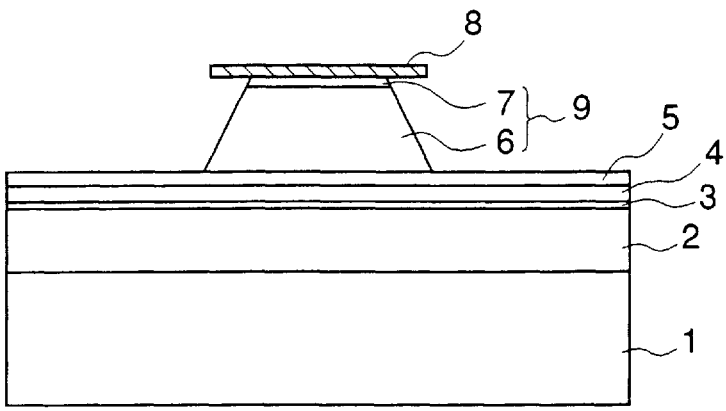
Figure 2:
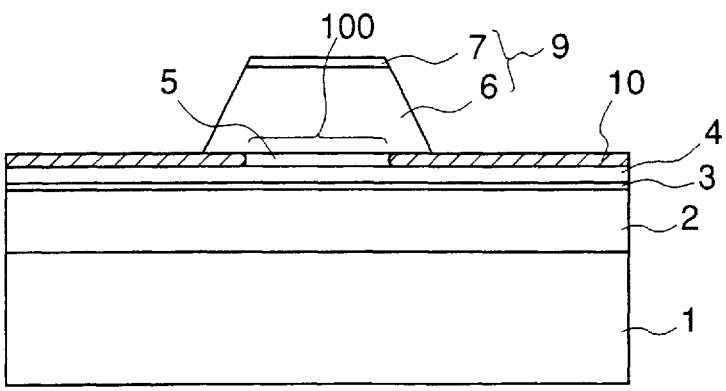
Figure 3:
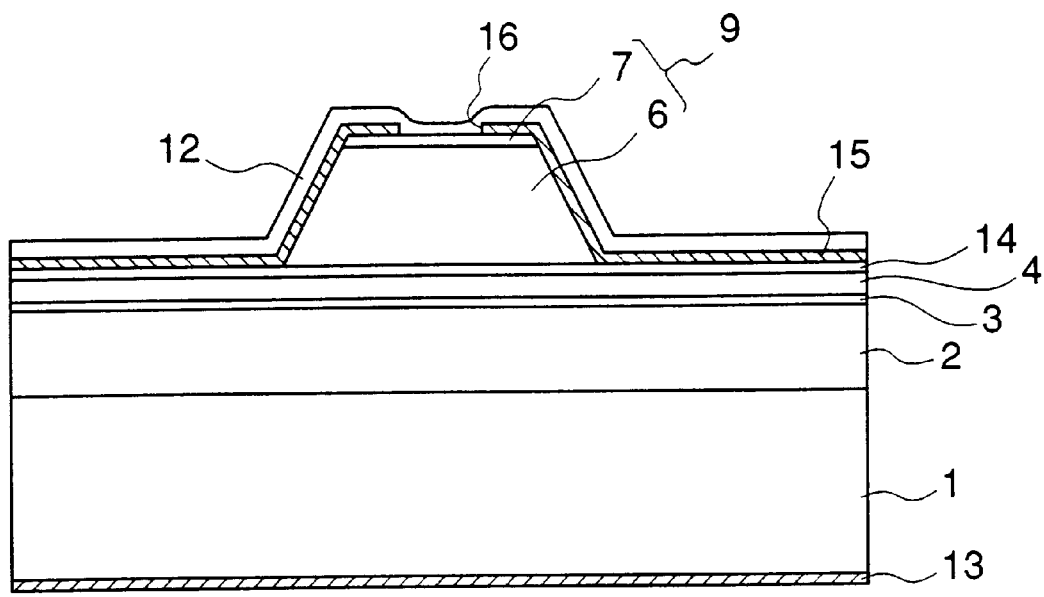
FIG. 3 is a cross-sectional view illustrating a semiconductor laser according to the prior art.
Figure 4:
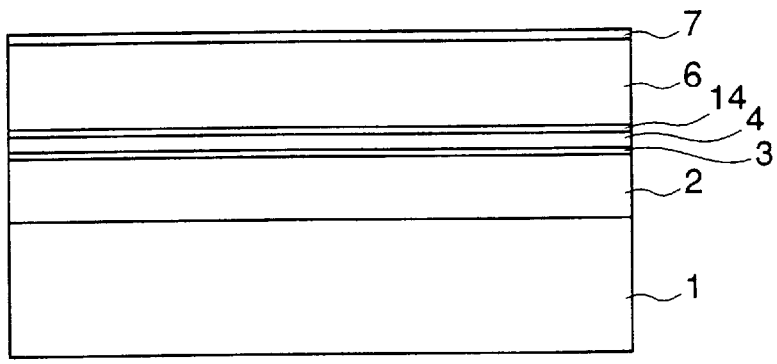
FIGS. 4(a)–4(d) are cross-sectional views illustrating a fabrication process of a semiconductor laser according to the prior art.
Figure 4:
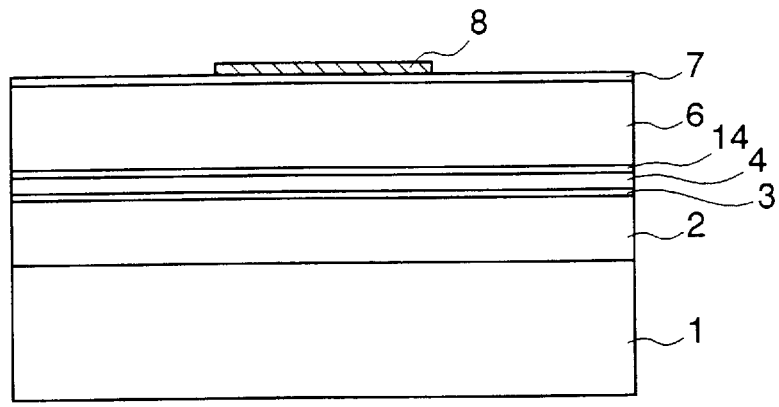
Figure 4:
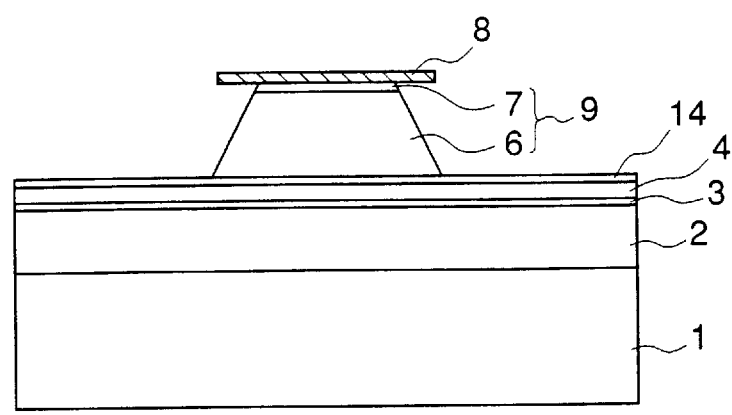
Figure 4:
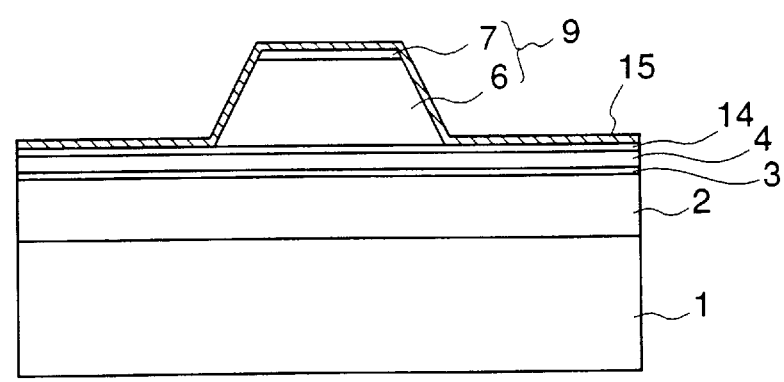

As shown in FIG. 2(a), on the n-GaAs substrate 1 in a wafer state(the wafer state is not shown), the n-$Al_{0.3}Ga_{0.7}As$ lower cladding layer 2, the quantum well active layer 3, the p-$Al_{0.3}Ga_{0.7}As$ first upper cladding layer 4, the p-AlAs current confinement layer 5, the p-$Al_{0.3}Ga_{0.7}As$ second upper cladding layer 6, and the p-GaAs contact layer 7 are epitaxially grown in this order using MOCVD(metal organic chemical vapor deposition) or the like. The thickness of the p-$Al_{0.3}Ga_{0.7}As$ first cladding layer 4 needs to be sufficient to stabilize the horizontal traverse oscillation mode. For example, the combined thickness of the p-$Al_{0.3}Ga_{0.7}As$ first upper cladding layer 4 and the p-AlAs current confinement layer 5 is in the range of 0.05 to 0.5 $\mu$m. And the thickness of thep-AlAs current confinement layer 5 may be less than about 0.3 $\mu$m, but the preferred thickness is more than 0.01 $\mu$m in order for the layer to be utilized as an etch-stopping layer.

Thereafter, the wafer is completely covered with an insulating film 8, and then the insulating film 8 is patterned in the shape of a stripe. The stripe-shaped insulating film 8 serves as a mask for the ridge-etching. Other materials besides those above-mentioned can be employed as long as they can serve as a mask.

As shown in FIG. 2(c), using the insulating film 8 as a mask, etching is performed so as to form a ridge waveguide 9. Namely, both the p-GaAs contact layer 7 and the p-$Al_{0.3}Ga_{0.7}As$ second upper cladding layer 6 alone are selectively etched to form the ridge waveguide 9, the etching being stopped at the p-AlAs current confinement layer 5. An example of a solution for such an etching step is a mixture of tartaric acid and hydrogen peroxide.

Thereafter, the stripe-shaped insulating film 8 is removed by wet or dry etching. As shown in FIG. 2(d), the p-AlAs current confinement layer 5 is oxidized to form the AlAs oxidized region 10 by a so-called wet oxidation method. How the wet oxidation method is performed here is described as follows: the wafer is placed into the chamber of an annealing furnace. Oxidation is carried out while water vapor flows into the chamber kept at temperatures in the range of 300 to 650° C. The size of the AlAs oxidized region 10 can be controlled by the annealing time since the progress of the oxidation going in both the vertical and lateral directions of the p-AlAs current confinement layer 5 is proportional to the annealing time to the power of one-half. Accordingly, the oxidation process can be stopped just at the time when the inward-proceeding front of the oxidized region of the current confinement layer 5 under the ridge waveguide 9 has come to a position about 0.5 μm away from the edge of the ridge, whereby the formation of the AlAs oxidized region 10 can be controlled by the annealing time. As a result, the non-oxidized region of the current confinement layer 5 is provided so that the longitudinal center axis thereof is positioned directly under the longitudinal center axis of the ridge waveguide 9. and so that the width thereof is narrower than the width of the side of the ridge waveguide 9 which is in contact with the current confinement layer 5. The p-AlAs current confinement layer 5 contains a higher composition ratio of Al than other semiconductor layers and Al is more easily oxidized, so the speed of the oxidation of the layer is much higher than the oxidation speed of other semiconductor layers so that oxidation of other semiconductor layers exposed on the surface is negligible in the step of forming the AlAs oxidized region 10. Although the oxidation goes beneath the surface of the current confinement layer 5, it hardly intrudes into the first upper cladding layer 4. The oxidation of the current confinement layer 5 can be stopped when it has reached the first upper cladding layer 4. Therefore, the current confinement layer 5 can be readily and exclusively oxidized. It is still possible to use other methods for oxidation of the current confinement layer 5.

Thereafter, the entire wafer is covered with the insulating film 15. With the use of a photolithographic technique, only a portion of the insulating film 15 positioned on the upper flat surface of the ridge waveguide 9 is removed by dry etching or the like in such a way as to form the opening 16. Further, the p side electrode 12 is formed on the insulating film 15. Thus, the p side electrode 12 enables contact with the contact layer 7 only through the opening 16 of the insulating film 15 on the upper portion of the ridge waveguide 9. As a result, the current flows only through the opening 16. Thereafter, the n side electrode 13 is formed on the rear surface of the substrate 1. The wafer is cleaved into chips, making facets of laser resonators, thereby resulting in a semiconductor laser shown in FIG. 1.

A description is given of how this semiconductor laser operates, referring to FIG. 1.

When a voltage is applied across the p side electrode 12 as a plus pole and the n side electrode 13 as a minus pole, holes are injected from the upper flat surface of the ridge waveguide 9 into the quantum well active layer 3 through the p-GaAs contact layer 7, the p-AlGaAs second upper cladding layer 6, and the p-AlGaAs upper cladding layer 4, and electrons are also injected into the quantum well active layer 3 through the n-GaAs substrate 1 and the n-AlGaAs lower cladding layer 2. The recombination of electrons and holes occurs in the active region of the quantum well active layer 3, producing light by the stimulated emission of radiation. If a sufficient volume of carriers is injected to produce light greater than the loss of the ridge waveguide, laser oscillation will occur. With this semiconductor laser, the current can flow only through the upper flat surface of the ridge waveguide 9 because the other regions are covered with the insulating film 15; namely, the current enters from the upper flat surface of the ridge waveguide 9 into the main body of the ridge and is confined therein.

A semiconductor layer which contains a high composition ratio of Al, if oxidized, develops insulating properties. Therefore, in this semiconductor laser, the AlAs oxidized region 10 in the p-AlAs current confinement layer 5 is made insulating by oxidation The non-oxidized region of the current confinement layer 5, i.e., the region thereof except the AlAs oxidized region 10, is one through which current can flow. The region is positioned under the ridge waveguide 9, its width being narrower than the width of the side of the ridge waveguide 9 facing the current confinement layer 5. Accordingly, the current entering from the p side electrode 12 is confined in the ridge waveguide 9 while it flows therein, and is further confined by the AlAs oxidized region 10 of the p-AlAs current confinement layer 5 and flows through the non-oxidized region of the p-AlAs current confinement layer 5 into the first upper cladding layer 4. Thereafter, the current is injected into the active layer 3. Thus, this semiconductor laser can facilitates the flow of a more confined current into the first upper cladding layer 4 than the above-mentioned prior art laser which performs current confinement only with a ridge waveguide. As a result, even when the thickness of the first upper cladding layer 4 is increased, it is possible to increase the volume of the current which flows into the active layer 3 just under the ridge waveguide 9 with a reduction in ineffective current.

Thus, in the first embodiment, the p-AlAs current confinement layer 5 comprises the current confinement region 100 having a desired width, shaped like a strip extending in a direction perpendicular to facets of the laser resonator, the oxidized region 10, and the p-AlGaAs second upper cladding layer 6 shaped like a ridge, one side of which faces the current confinement layer 5 and has a larger width than the current confinement region 100, which is disposed on the current confinement layer 5, and having the longitudinal center axis positioned directly above the longitudinal center axis of the current confinement region 100. As a result, the current is confined by the AlAs oxidized region 10 which is the oxidized portion of the current confinement layer 5 so that the ineffective current which is not injected into the active region is reduced, even when the thickness of the first upper cladding layer 4 is increased.

Thus, a semiconductor laser which has high stability in the horizontal transverse oscillation mode and good characteristics without increasing the threshold current, the operating current and the like, is readily obtained.

Embodiment 2

Figure 8:
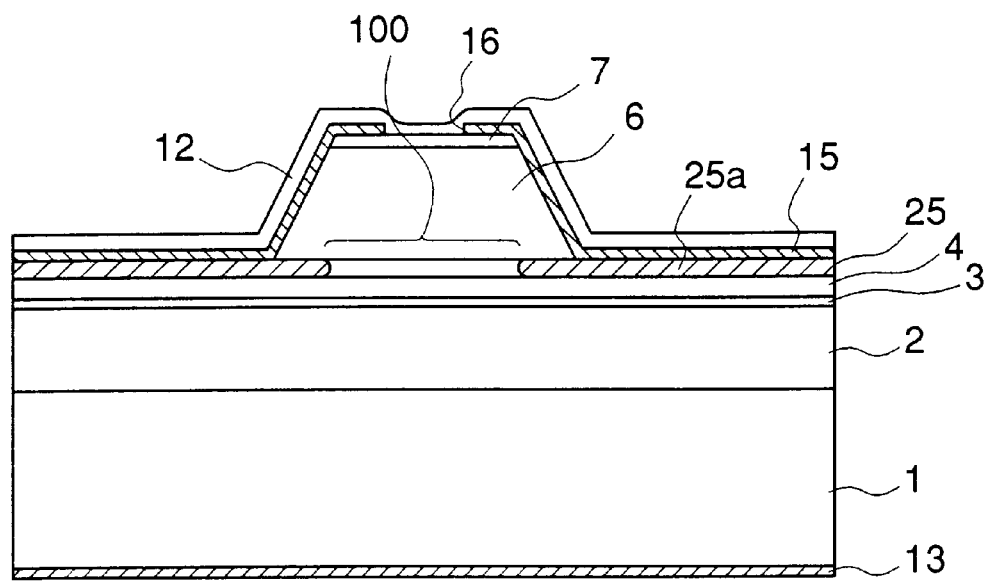
FIG. 8 is a cross-sectional view illustrating a semiconductor laser according to a second embodiment of the present invention.

FIG. 8 is a cross-sectional view of a semiconductor laser according to a second embodiment of the present invention. In the figure, the same reference numerals as those shown in FIG. 1 designate the identical or corresponding parts. The semiconductor laser according to the second embodiment is the same as the semiconductor laser in the first embodiment except that a p-AlGaAs current confinement layer 25, which includes the oxidized region 25a, is provided for the former in place of the p-AlAs current confinement layer including the oxidized region for the latter. It should be noted that the current confinement layer 25 must have a higher composition ratio of Al than other semiconductor layers of the semiconductor laser because it is necessary that the current confinement layer 25 alone be oxidized in the oxidation step in which an AlGaAs oxidized region 25a is formed.

The fabrication process of the semiconductor laser according to the second embodiment is the same as that of the semiconductor laser in the first embodiment except that the step of forming the p-AlGaAs current confinement layer 25 is performed for the former in place of the step of forming the p-AlAs current confinement layer for the latter.

In general, as a semiconductor layer has a higher composition ratio of Al, its crystallinity is reduced, which adversely affects the reliability of the device with the passage of time. It is preferable for the current confinement layer under the ridge waveguide have as low a composition ratio of Al as possible. In the second embodiment, the p-AlGaAs current confinement layer 25 including the oxidized region 25a is provided on the first upper cladding layer 4, whereby this semiconductor laser is within the scope of the invention. Furthermore, since the current confinement layer 25 has a lower composition ratio of Al than the AlAs current confinement layer of the first embodiment, a semiconductor laser with both superior crystallinity and high reliability is realized.

In addition, the composition ratio of Al of the p-AlGaAs current confinement layer 25 should make it possible for the layer to be easily oxidized, but also the layer has to serve as an etch-stopping layer in the step of forming a ridge waveguide. Consequently, the preferred composition ratio of Al of the p-AlGaAs current confinement layer 25 is between 0.55 and 0.95.

Embodiment 3

Figure 5:
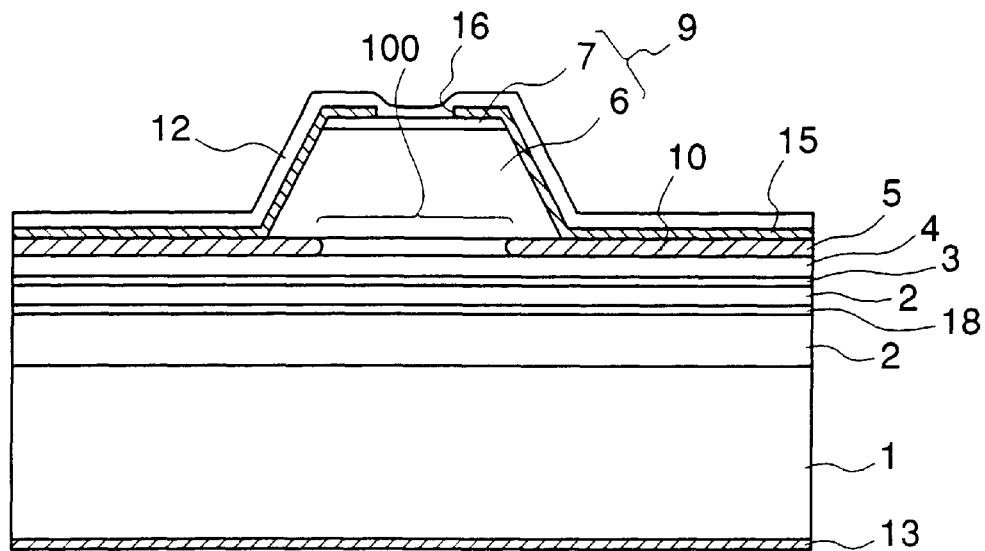
FIG. 5 is a cross-sectional view illustrating a semiconductor laser according to a third embodiment of the present invention.

FIG. 5 is a cross-sectional view of a semiconductor laser according to a third embodiment of the present invention. In the figure, the same reference numerals as those shown in FIG. 1 designate the identical or corresponding parts. In the semiconductor laser of the third embodiment, an n-AlAs refractive index compensation layer 18 which is made of the same material and has the same thickness as the current confinement layer 5 is inserted into the n-$Al_{0.3}Ga_{0.7}As$ lower cladding layer 2 in such a way as to be symmetrical to the current confinement layer 5 with respect to the active layer 3.

This semiconductor laser is produced with the fabrication process of the first embodiment and an additional step in which the n-AlAs refractive index compensation layer 18 is grown halfway in the step of growing the lower cladding layer 2.

The third embodiment obtains the same effect as the first embodiment. Further, because the refractive index compensation layer 18 with the same composition ratio and thickness as the current confinement layer 5 is symmetrical relative to the p-AlAs current confinement layer 5 with respect to the active layer 3, the refractive index along a direction perpendicular to the surface of the substrate 1 in the vicinity of the active layer 3 is symmetrical with respect to the active layer 3 so that the transverse mode of the oscillation will have a symmetrical form along a direction perpendicular to the substrate 1.

In the third embodiment of the present invention, emphasis has been placed upon a semiconductor laser including a refractive index compensation layer. However, a semiconductor laser of the second embodiment including an n type refractive index compensation layer which is made of the same material and has the same thickness as the current confinement layer, is within the scope of the invention.

Embodiment 4

Figure 6:
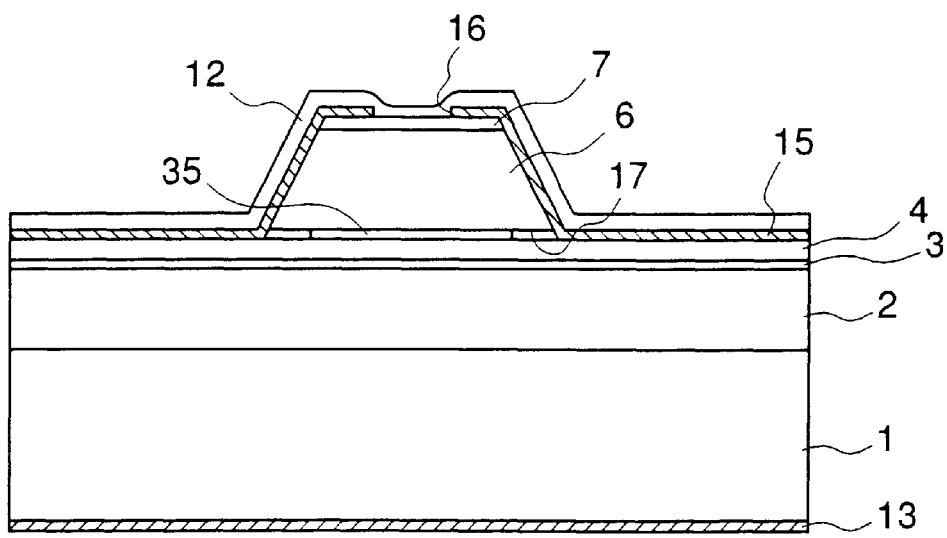
FIG. 6 is a cross-sectional view illustrating a semiconductor laser according to a third embodiment of the present invention.

FIG. 6 is a cross-sectional view of a semiconductor laser according to a fourth embodiment. In the figure, the same reference numerals as those shown in FIG. 1 designate identical or corresponding parts. An AlAs current confinement layer 35 is disposed between the first upper cladding layer 4 and the ridge waveguide 9, the longitudinal center axis thereof being located directly under the longitudinal center axis of the ridge waveguide 9. The width is narrower than the width of the side of the ridge waveguide 9 which is in contact with this current confinement layer 35. The distance between both lateral edges of the current confinement layer 35 is about 0.5 $\mu$m. A side etching groove 17 is formed by etching in a direction parallel to the surface of the substrate 1, namely side-etching. The base of the side etching groove 17 is the side of the current confinement layer 5, and the sides thereof are one of the first upper cladding layer 4 and one of the ridge waveguide 9, respectively.

Figure 7:
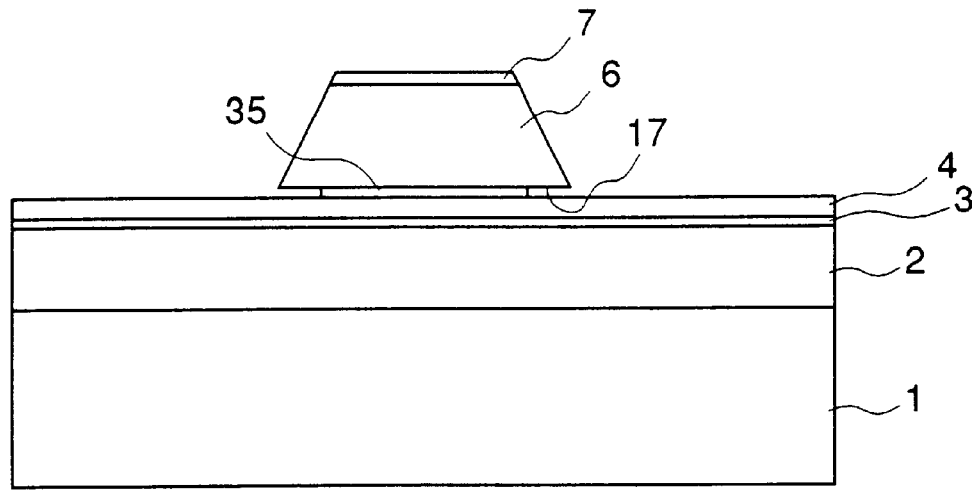
FIG. 7 is a cross-sectional view illustrating a principal fabrication process of a semiconductor laser according to a fourth embodiment of the present invention.

FIG. 7 is a cross-sectional view of a fabrication process of the semiconductor laser of the fourth embodiment In the figure, the same reference numerals as those shown in FIG. 6 designate the identical or corresponding parts.

A description is given of the fabrication process, referring to FIG. 7.

In a similar way to the fabrication process of the first embodiment, the lower cladding layer 2, the active layer 3, the first upper cladding layer 4, the current confinement layer 35, the second upper cladding layer 6, and the contact layer 7 are successively grown on the substrate 1. Thereafter, using an insulating film shaped like a stripe extending in the longitudinal direction of laser resonator as a mask, the contact layer 7 and the second upper cladding layer 6 are selectively etched to form the ridge wave guide 9. In this case, using a mixture of tartaric acid and hydrogen peroxide, etching towards the substrate 1 can be stopped when it reaches the current confinement layer 35. Thereafter, using a mixture of hydrofluoric acid and water, the p-AlAs current confinement layer 35 is easily etched, the ridge waveguide 9 and the first upper cladding layer 4 being excluded from the etching. By the etching, regions of the current confinement layer 35 adjoining the ridge waveguide 9 are removed, and other regions in the vicinity, under the lateral edges of the ridge waveguide 9, are side-etched to form the side etching groove 17.

Thereafter, in a similar way to the fabrication of the first embodiment, the insulating film 15, the p side electrode 12, and the n side electrode 13 are formed on top and bottom of the wafer respectively, thereby producing the semiconductor laser shown in FIG. 6.

In the fourth embodiment, since the width of the current confinement layer 35 is narrower than the width of the side of the ridge waveguide 9 which is in contact with the current confinement layer 35, the current flowing in the ridge waveguide 9 does not flow into the side etching groove 17. Thus, the current is confined by the current confinement layer 25 and flows into the current confinement layer 35 which has a narrower width than the ridge waveguide 9. This semiconductor laser is within the scope of the invention.

In the fourth embodiment of the present invention, emphasis has been placed upon a semiconductor laser including an AlAs current confinement layer 35. However, a semiconductor laser including a current confinement layer which is made of a material which can be etched while not etching the first upper cladding layer 4 and the second upper cladding layer 6 i.e., a semiconductor material which contains a higher composition ratio of Al than those two layers, is within the scope of the invention.

In the first to fourth embodiments of the present invention, emphasis has been placed upon semiconductor lasers including semiconductor layers made of AlGaAs and GaAs. However, a semiconductor laser including semiconductor layers which are made of other materials with a current confinement layer made of a semiconductor material which has a higher composition ratio of Al than both the first and second upper cladding layers, is within the scope of the invention.

In the first to fourth embodiments of the present invention, emphasis has been placed upon semiconductor lasers including a substrate of n type conductivity. However, a semiconductor laser including a substrate of which the conductivity is p type, n type semiconductor layers of which conductivity was p type in the described embodiments and p type semiconductor layers in which conductivity was n type in the above-described embodiments, is within the scope of the invention.

In the first to fourth embodiments of the present invention, emphasis has been placed upon semiconductor lasers including an insulating film which has an opening positioned only on the upper flat surface of a ridge waveguide. However, other semiconductor lasers, such as a buried ridge type semiconductor laser in which a ridge waveguide is buried with a current blocking layer or the like, etc., are within the scope of the invention.

What is claimed is:

1. A semiconductor laser comprising:

a first conductivity type semiconductor substrate;

a first conductivity type lower cladding layer, an active layer, and a second conductivity type first upper cladding layer, disposed in this order on said first conductivity type semiconductor substrate;

a second conductivity type current confinement layer disposed on said first upper cladding layer, made of a semiconductor material containing a higher composition ratio of Al than said first upper cladding layer and having a stripe shape with a width and extending in a direction; and a second conductivity type second upper cladding layer made of the same material as said first upper cladding layer, disposed on said current confinement layer so that a central longitudinal axis of said current confinement layer is located directly opposite a central longitudinal axis of said current confinement region, and having a ridge structure with a bottom surface facing said first upper cladding layer, in contact with, and having a width larger than the width of said current confinement layer.

2. The semiconductor laser of claim 1 wherein the bottom surface of said ridge structure includes portions not contacting said current confinement layer and spaced from said first upper cladding layer by respective grooves.

3. The semiconductor laser of claim 2 wherein the grooves are not filled with solid material.

4. The semiconductor laser of claim 3 including a contact layer of the second conductivity type disposed on a top surface of said second upper cladding layer, opposite the bottom surface of said second upper cladding layer, an insulating layer disposed on said first upper cladding layer and on said ridge structure and including a central opening exposing a part of said contact layer, a first electrode disposed on said insulating layer and contacting said contact layer through the central opening, and a second electrode disposed on said semiconductor substrate.

* * * * *